United States Patent [19]
Ohike

[11] Patent Number: 5,357,190
[45] Date of Patent: Oct. 18, 1994

[54] CROSS COIL TYPE INDICATOR IN WHICH THE WIRE OF EACH COIL IS CONNECTED TO A TERMINAL BY SOLDERING

[75] Inventor: Yukio Ohike, Shizuoka, Japan
[73] Assignee: Yazaki Corporation, Tokyo, Japan
[21] Appl. No.: 935,175
[22] Filed: Aug. 26, 1992
[30] Foreign Application Priority Data
Aug. 26, 1991 [JP] Japan .............................. 3-067514[U]
[51] Int. Cl.⁵ ...................... G01R 11/30; G01R 11/36
[52] U.S. Cl. .................................................... 324/143
[58] Field of Search ............. 324/143, 146; 174/94 R; 29/860; 439/449

[56] References Cited
U.S. PATENT DOCUMENTS
3,456,339  7/1969  Small ..................................... 29/860

FOREIGN PATENT DOCUMENTS
1097042  11/1958  Fed. Rep. of Germany .
3219290   1/1983  Fed. Rep. of Germany .
328382    6/1991  Japan .

*Primary Examiner*—Walter E. Snow
*Attorney, Agent, or Firm*—Sughrue, Mion, Zinn, Macpeak & Seas

[57] ABSTRACT

According to the present invention, a cross coil indicator comprises a coil bobbin; a pair of coils wound around said coil bobbin, said coils being disposed orthogonally to each other; a magnet rotor disposed in an inner portion of said coil bobbin, said magnet rotor rotating with a center axis thereof at a predetermined angle determined in accordance with a composite magnetic field generated by the said coils energized; pin connectors disposed on an outer peripheral portion of said coil bobbin at the same interval between adjacent said poles, wherein said pin connector has a first wire winding portion for winding an end portion of said coil is formed at the end portion of said pin connector and a second wire winding portion for winding said coil extended from said first winding portion toward said coil bobbin is formed below said first winding portion, and said first portion is soldered.

2 Claims, 2 Drawing Sheets

CROSS COIL TYPE INDICATOR IN WHICH THE WIRE OF EACH COIL IS CONNECTED TO A TERMINAL BY SOLDERING

BACKGROUND OF THE INVENTION

The present invention relates to a cross type indicator. More particularly, the present invention relates to a cross coil type indicator constructed in a compact configuration wherein the end part of a wire extending from each coil is fixedly connected to the corresponding pin-shaped terminal by soldering.

Many indicators each including a cross coil type movement section are usually used for vehicles. Specifically, an indicator of the foregoing type is constructed such that a pair of coils for generating magnetic fields orienting at a right angle relative to each other are activated by feeding an electric current thereto of which intensity varies corresponding to a desired measurement quantity, and a magnet rotor is rotated in the direction of the composite magnetic field derived from the foregoing magnetic fields generated by the coils, whereby the measurement quantity is indicated by a pointer adapted to be rotated together with the magnet rotor. In recent years, there is a tendency that various kinds of components such as a calculating unit or the like are arranged peripheral to the movement section of the indicator. For this reason, many compact type indicators of which movement section is constructed in a compact configuration have been practically used at present.

A typical conventional cross coil type indicator will be described below with reference to FIG. 3 and FIG. 4.

The indicator includes a coil bobbin 1 on which a pair of coils 2 are disposed orthogonally to each other, and four posts 3 are caused to stand upright around the outer peripheral part of the coil bobbin 1 in the equally spaced relationship in the circumferential direction with an angle of 90 degrees between adjacent posts 3 so as to allow the coils 2 to be wound about the respective posts 3. Among the four posts 3, a pair of posts 3a arranged symmetrically relative to a rotational shaft 8 to be described later are dimensioned to have a height more than that of another pair of posts 3b. Terminal holding portions 4 each having a pin-shaped terminal 5 extending therethrough substantially in parallel with the posts 3 are integrated with the coil bobbin 1 at the positions located outside of the posts 3. It should be noted that the aforementioned components are accommodated in a case (not shown) for a movement section of the indicator.

As shown in FIG. 4, the end part of a wire extending from each coil 2 is secured to the pin-shaped pin 5 by winding the former about the latter by a few turns, and the wound wire is fixed thereto by soldering it at 6.

Circular disc-shaped magnet rotor 7 having S poles and N poles is rotatably received in the coil bobbin 1, and a rotational shaft 8 is fitted to the central part of the magnet rotor 7 while extending in the axial direction of the coil bobbin 1. While the coils 2 are not activated without any electric current fed thereto, the magnet rotor 7 is freely rotatable about the center axis of the rotational shaft 8. When each coil 2 is fed with an electric current, the magnet rotor 7 is rotationally driven by a predetermined angle.

A spirally extending spring 9 is disposed on the magnet rotor 8 in such a manner that one end of the spring 9 is fixedly secured to the upper end of one post 3a, while the other end of the same is fixedly secured to the rotational shaft 8. While the coils 2 are not activated without any electric current fed thereto and the magnet rotor 7 is freely rotatable, the rotational shaft 8 is returned to a zero position on a dial (not shown) by the resilient force of the spirally extending spring 9.

The movement section of the indicator constructed in the above-described manner is fixedly mounted on the upper surface of a printed circuit board (not shown) molded of a hard synthetic resin by securing the pin-shaped terminals 5 to the printed circuit board. In addition, a dial (not shown) having a light permeable plate attached to the rear surface thereof is placed on the upper surface of the movement section, and a pointer (not shown) is secured to a part of the rotational shaft 8 projected outside of the dial, whereby the indicator is constructed as an instrument unit. Subsequently, the indicator is accommodated in a predetermined case by immovably holding the printed circuit board with the aid of support posts (not shown) for the case.

With the conventional cross coil type indicator constructed in a compact configuration in the above-described manner, each coil 2 is electrically connected to the pin-shaped terminal 5 by soldering the end part of a wire extending from the coil 2 directly to the pin-shaped terminal 5 while winding it about the pin-shaped terminal 5 a few turns. Thus, there is a possibility that a part of the molten solder 6 will flow down to the coil bobbin 1 side along the wire of the coil 2, resulting in the tensile strength of the wire of the coil 2 being remarkably reduced. Another problem is that when a certain intensity of pulling force is applied to the wire of the coil 2, wire disconnection may occur at the position where the molten solder 6 is solidified on the wire. Once wire disconnection has occurred, the indicator fails to operate properly.

SUMMARY OF THE INVENTION

The present invention has been made in consideration of the foregoing problem.

An object of the present invention is to provide a cross coil type indicator which assures that undesirable reduction of the tensile strength of a wire extending from each coil at a connecting location where the wire is fixedly soldered to the corresponding pin-shaped terminal can reliably be prevented.

According to an aspect of the present invention, there is provided that a cross coil indicator comprises a coil bobbin; a pair of coils wound around said coil bobbin, said coils being disposed orthogonally to each other; a magnet rotor disposed in an inner portion of said coil bobbin, said magnet rotor rotating with a center axis thereof at a predetermined angle determined in accordance with a composite magnetic field generated by the said coils energized; pin connectors disposed on an outer peripheral portion of said coil bobbin at the same interval between adjacent said poles, wherein each pin connector has a first wire winding portion for winding an end portion of said coil formed at the end portion of said pin connector and a second wire winding portion for winding said coil extended from said first winding portion toward said coil bobbin formed below said first winding portion, and said first portion is soldered.

According to the present invention, the cross coil type indicator includes wire winding portions which is composed of a first winding portion located at the foremost end of each pin-shaped terminal and a second winding portion located subsequent to the first winding portion on the pin-shaped terminal.

The first winding portion is fixedly secured to the pin-shaped terminal by soldering while the end part of a wire extending from each coil is wound about the pin-shaped terminal by a few turns. On the other hand, the second winding portion serves as a preliminary winding portion without no soldering to the pin-shaped terminal while a part of the wire subsequent to the first mentioned part is wound about the pin-shaped terminal by a few turns. With the provision of the second winding potion on the pin-shaped terminal in that way, any part of molten solder does not flow down to the coil bobbin side over the preliminary winding portion during each soldering operation. Thus, there does not arise a malfunction that the tensile strength of a wire extending from each coil is undesirably reduced. With such construction, there is no possibility that wire disconnection occurs when a certain intensity of pulling force is applied to the wire.

DETAILED DESCRIPTION OF THE PREFERRED EMBODIMENT

Figure 1:
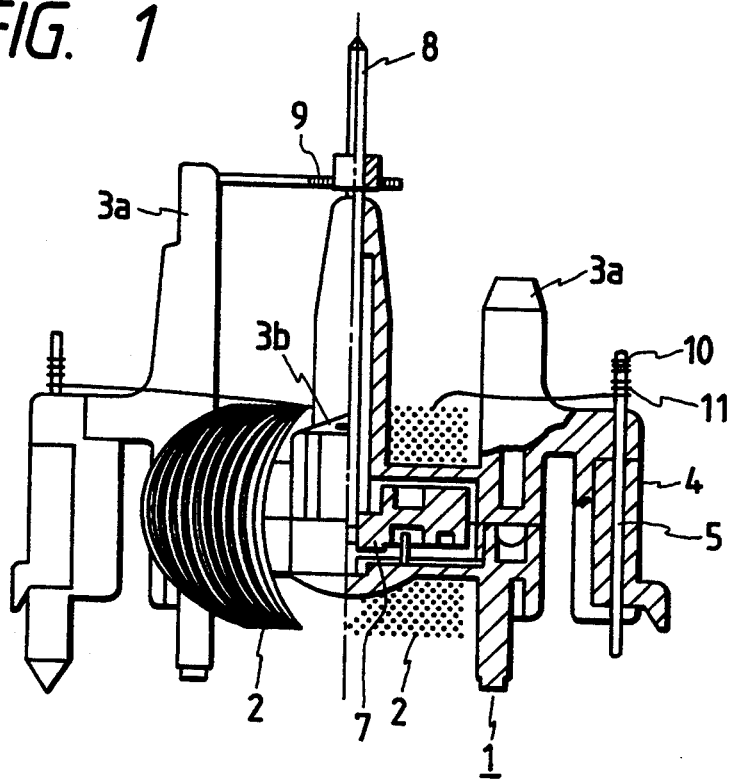
FIG. 1 is a partially sectioned front view of a cross coil type indicator in accordance with an embodiment of the present invention.

The present invention will now be described below with reference to FIG. 1 and FIG. 2 which illustrate a cross-coil type indicator in accordance with a preferred embodiment of the present invention. It should be noted that same parts or components as those shown in FIG. 3 and FIG. 4 are designated by same reference numerals.

In this embodiment, the indicator includes a coil bobbin 1 on which a pair of coils 2 are disposed orthogonally to each other, and four posts 3 are caused to stand upright around the outer peripheral part of the coil bobbin 1 in the equally spaced relationship in the circumferential direction with an angle of 90 degrees between adjacent posts 3 so as to allow the coils 2 to be wound about the respective posts 3. Among the four posts 3, a pair of posts 3a arranged symmetrically relative to a rotational shaft 8 to be described later are dimensioned to have a height more than that of another pair of posts 3b. Terminal holding portions 4 each having a pin-shaped terminal 5 extending therethrough substantially in parallel with the posts 3 are integrated with the coil bobbin 1 at the positions located outside of the posts 3. It should be noted that the aforementioned components are accommodated in a case (not shown) for a movement section of the indicator.

Each pin-shaped terminal 5 includes a stationary winding portion 10 at the foremost end thereof so as to allow the end part of a wire extending from each coil 2 to be fixedly secured thereto via winding and soldering. In addition, it includes a preliminary winding portion 11 below the stationary winding portion 10, and the end part of the wire extending from each coil 2 is wound about the pin-shaped terminal 5 at the preliminary winding portion 11 without any soldering by a few turns. Thus, the coil 2 is electrically connected to the pin-shaped terminal 5 by soldering the wire to the stationary winding portion 10 while winding the former about the latter by a few turns.

A circular disc-shaped magnet rotor 7 having S poles and N poles magnetically formed thereon is rotatably received in the coil bobbin 1, and a rotational shaft 8 adapted to be normally biased in the direction toward a zero position on a dial (not shown) by the resilient force of a spirally extending coil 9 is fixedly secured to the central part of the magnet rotor 7 while extending along the center axis of the same.

The movement section of the indicator constructed in the above-described manner is fixedly mounted on the upper surface of a printed circuit board (not shown) molded of a hard synthetic resin by securing the pin-shaped terminals 5 to the printed circuit board. In addition, a dial (not shown) having a light permeable plate attached to the rear surface thereof is placed on the upper surface of the movement section, and a pointer (not shown) is fixedly attached to the foremost part of the rotational shaft 8 projected outside of the dial, whereby the indicator of the present invention is constructed as an instrument unit.

Figure 2:
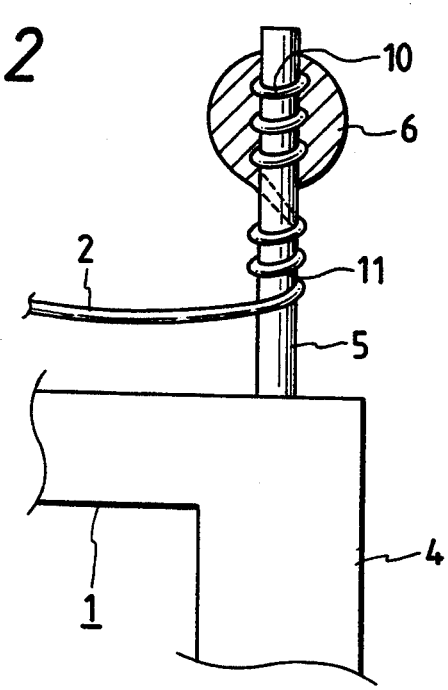
FIG. 2 is a fragmentary enlarged view of the indicator shown in FIG. 1, particularly illustrating a connecting location where a wire extending from a coil is connected to a pin-shaped terminal.
Figure 3:
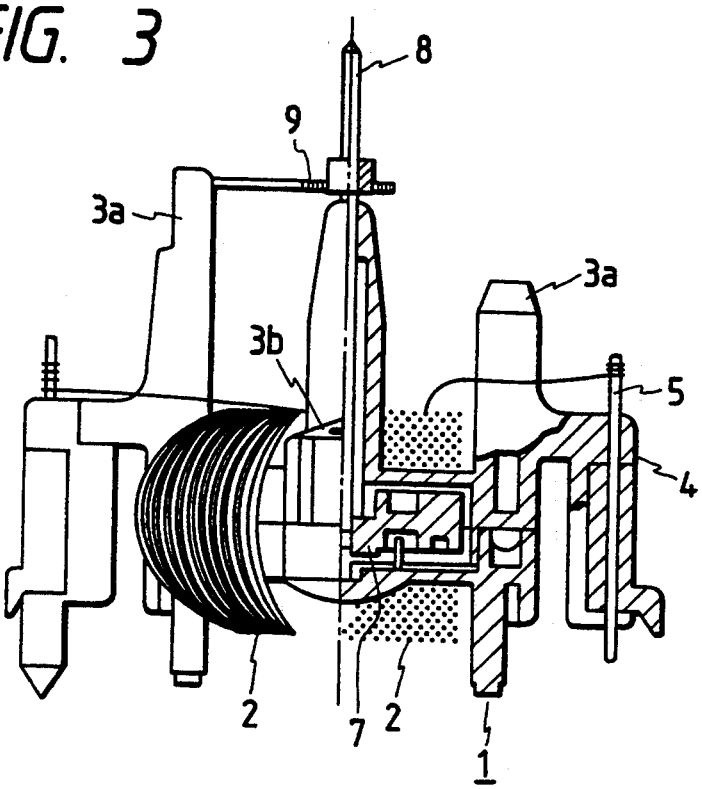
FIG. 3 is a partially sectioned front view of a conventional cross coil type indicator.
Figure 4:
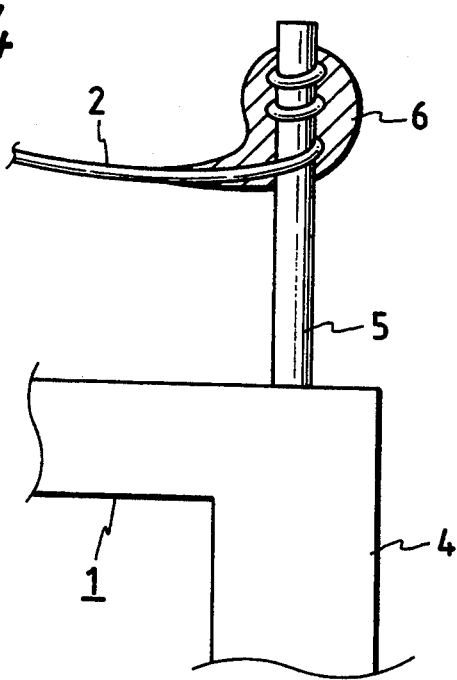
FIG. 4 is a fragmentary enlarged view of the indicator shown in FIG. 3.

As shown in FIGS. 1 and 2, the indicator according to the present invention is composed of substantially the same components as those shown in FIG. 3. Therefore, the duplicated description will be omitted.

Next, a mode of operation of the indicator constructed as mentioned above will be described below.

First, a measurement signal indicating, e.g., a speed of a vehicle is inputted into the printed circuit board in which the signal is processed to generate a certain intensity of electric current. This electric current is then outputted from the printed circuit board to the coils 2 in the indicator as a driving signal corresponding to the inputted measurement signal. As the foregoing electric current is fed to the coils 2 via the pin-shaped terminals 5, the magnet rotor 7 is rotated by an angle corresponding to the measured quantity under the influence of the composite magnetic field derived from the magnetic fields generated by the coils 2. Subsequently, the rotational shaft 8 is rotated by the magnet rotor 7, causing the pointer secured to the foremost end of the rotational shaft 8 to be correspondingly rotated on the dial to indicate the measurement quantity with the pointer. At this time, the spirally extending spring 9 is held in the operative state that its resilient force is accumulatively increased as the rotational shaft 8 is rotated. For this reason, the pointer is returned to the zero position by the accumulatively increased resilient force of the spirally extending spring 9 when there arises an occasion that the coils 2 are not activated because, e.g., the vehicle stops its running.

In the aforementioned embodiment, the end part of a wire extending from each coil 2 is fixedly secured to each pin-shaped terminal 5 by winding the former about the latter at two locations, i.e., the stationary winding portion 10 and the preliminary winding portion 11, and the wire wound about the stationary winding portion 10 is reliably fixed to the pin-shaped terminal 5 by soldering. Thus, even when molten solder flows down from the stationary winding portion 10 along the pin-shaped terminal 5 during each soldering operation, it reaches the preliminary winding portion 11 so far without any occurrence of a malfunction that it flows down to the coil bobbin 1 side over the preliminary winding portion 11 and thereby the tensile strength of the wire extending from each coil 2 on the coil bobbin 1 side is undesirably reduced due to the solidified solder 6.

In other words, the arrangement of the preliminary winding portion 11 on the pin-shaped terminal 5 can reliably prevent the tensile strength of the wire extending from the coil 2 from being undesirably reduced due to flowing-down of the molten solder 6 during each soldering operation. Thus, even when a certain intensity of pulling force is applied to the wire of the coil 2, there does not arise a malfunction that wire disconnection occurs with the coil 2, resulting in the indicator failing to operate properly.

While the present invention has been described above with respect to a single preferred embodiment thereof, it should of course be understood that the present invention should not be limited only to this embodiment but various change or modification may be made without departure from the scope of the present invention as defined by the appended claims.

What is claimed is:

1. A cross coil indicator comprising:

a coil bobbin;

a pair of coils respectively formed by winding a wire around said coil bobbin, said coils being disposed orthogonally to each other;

a magnet rotor disposed in an inner portion of said coil bobbin, said magnet rotor rotating with a center axis thereof at a predetermined angle determined in accordance with a composite magnetic field generated by passing a current through said coils;

pin connectors disposed on an outer peripheral portion of said coil bobbin, wherein each pin connector has a first wire winding portion formed at an end portion of said pin connector and a second wire winding portion formed below said first winding portion, an end portion of said wire being wound around said first and second winding portions and wherein only said first portion is soldered.

2. A cross coil indicator as claimed in claim 1, wherein a portion of said wire extending from said first winding portion to said coil bobbin is wound around said second winding portion.

* * * * *